US012656681B2

(12) United States Patent
Chacko

(10) Patent No.: US 12,656,681 B2
(45) Date of Patent: Jun. 16, 2026

(54) LIGHT PATTERNABLE SURFACE MODIFICATION

(71) Applicant: Brewer Science, Inc., Rolla, MO (US)

(72) Inventor: Reuben T. Chacko, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 78 days.

(21) Appl. No.: 18/747,908

(22) Filed: Jun. 19, 2024

(65) Prior Publication Data

US 2024/0427240 A1 Dec. 26, 2024

Related U.S. Application Data

(60) Provisional application No. 63/521,740, filed on Jun. 19, 2023.

(51) Int. Cl.

| | |
|---|---|
| ***G03F 7/038*** | (2006.01) |
| ***C08F 220/18*** | (2006.01) |
| ***C09D 133/10*** | (2006.01) |
| ***G03F 7/16*** | (2006.01) |

(52) U.S. Cl.

CPC ........ *G03F 7/038* (2013.01); *C08F 220/1818* (2020.02); *C09D 133/10* (2013.01); *G03F 7/162* (2013.01); *G03F 7/168* (2013.01)

(58) Field of Classification Search

CPC .......... G03F 7/038; G03F 7/162; G03F 7/168; C08F 220/1818; C09D 133/10

See application file for complete search history.

(56) References Cited

U.S. PATENT DOCUMENTS

| | | | | |
|---|---|---|---|---|
| 3,359,109 | A * | 12/1967 | Yembrick, Jr. ........ | G03C 1/732 430/340 |
| 4,062,685 | A * | 12/1977 | Takeda .................. | G03C 1/734 430/495.1 |
| 10,385,335 | B2 * | 8/2019 | McGall .............. | C12N 15/1093 |
| 11,574,805 | B2 | 2/2023 | Dai et al. | |
| 2006/0275966 | A1 * | 12/2006 | Park ........................ | H01J 9/025 438/182 |
| 2007/0015277 | A1 | 1/2007 | Hattori et al. | |
| 2012/0027933 | A1 * | 2/2012 | Zheng .................... | G02B 1/115 427/337 |

(Continued)

FOREIGN PATENT DOCUMENTS

| | | |
|---|---|---|
| CN | 101560061 A | 10/2009 |
| CN | 101560062 A | 10/2009 |

(Continued)

OTHER PUBLICATIONS

Holden, Matthew A., et al., "Light Activated Patterning of Dye-Labeled Molecules on Surfaces". J. AM.CHEM.SOC. 2003, 125, 8074-8075.*

(Continued)

*Primary Examiner* — Bret P Chen

(74) *Attorney, Agent, or Firm* — HOVEY WILLIAMS LLP

(57) ABSTRACT

Materials and methods for modifying surfaces in order to change surface energy are provided. These surface properties cause the surface to become more hydrophobic or oleophobic after light exposure. The ability to change surface energy upon exposure allows these materials to be patterned and enables a variety of uses, notably for use on semiconductor substrates in photolithography.

10 Claims, 2 Drawing Sheets

(56) References Cited

U.S. PATENT DOCUMENTS

| | | | | |
|---|---|---|---|---|
| 2014/0038102 | A1* | 2/2014 | Park | G03F 7/038<br>430/311 |
| 2014/0335459 | A1* | 11/2014 | Im | B82Y 40/00<br>430/324 |
| 2015/0147485 | A1 | 5/2015 | Studer et al. | |
| 2016/0181100 | A1 | 6/2016 | Devilliers et al. | |
| 2017/0256396 | A1 | 9/2017 | Cheng et al. | |
| 2019/0064667 | A1 | 2/2019 | Glodde et al. | |
| 2021/0082683 | A1* | 3/2021 | Dai | H10P 14/687 |

FOREIGN PATENT DOCUMENTS

| | | | | |
|---|---|---|---|---|
| CN | 101398614 B | | 3/2011 | |
| CN | 102643397 A | | 8/2012 | |
| CN | 104597230 A | | 5/2015 | |
| CN | 105296977 A | | 2/2016 | |
| CN | 107012450 A | | 8/2017 | |
| EP | 2087838 A1 | | 8/2009 | |
| FR | 2988093 A1 | | 9/2013 | |
| JP | H11263819 A | | 9/1999 | |
| JP | 2003-292716 | * | 10/2003 | C08L 45/00 |
| JP | 2009-508292 | * | 2/2009 | H01B 5/14 |
| KR | 2000-0010541 | * | 2/2000 | G03F 7/031 |
| KR | 20110008951 A | | 1/2011 | |
| KR | 20170029237 A | | 3/2017 | |
| WO | 2006084482 A1 | | 8/2006 | |
| WO | 2009098242 A1 | | 8/2009 | |
| WO | 2013135844 A1 | | 9/2013 | |
| WO | 2015080671 A1 | | 6/2015 | |
| WO | WO 2019/023690 A1 | * | 1/2019 | B01D 67/00 |
| WO | 2019038625 A1 | | 2/2019 | |
| WO | WO 2020/092963 A1 | * | 5/2020 | G03F 1/00 |

OTHER PUBLICATIONS

Domercq, Benoit, et al., "Photo-Patternable Hole-Transport Polymers for Organic Light-Emitting Diodes". Chem. Mater. 2003, 15, 1491-1496.*

Ruckenstein, E., et al., "Surface modification and functionalization through the self-assembled monolayer and graft polymerization". Advances in Colloid and Interface Science, vol. 113, Issue 1, Mar. 17, 2005, pp. 43-63.*

Dubner et al., "Light-Responsive Polymer Surfaces via Postpolymerization Modification of Grafted Polymer-Brush Structures," Langmuir, vol. 30, Issue 49, Nov. 24, 2014, pp. 14971-14981, abstract only attached, 9 pages.

Machine Translation of CN105296977, 6 pages.

Machine Translation of CN104597230, 12 pages.

Machine Translation of KR20110008951, 7 pages.

Machine Translation of CN107012450, 7 pages.

Machine Translation of CN101560061, 5 pages.

Machine Translation of JPH11263819, 6 pages.

Machine Translation of CN101398614, 7 pages.

Machine Translation of CN102643397, 6 pages.

Machine Translation of CN101560062, 5 pages.

Machine Translation of KR20170029237, 8 pages.

* cited by examiner

LIGHT PATTERNABLE SURFACE MODIFICATION

CROSS-REFERENCE TO RELATED APPLICATIONS

The present application claims the priority benefit of U.S. Provisional Patent Application Ser. No. 63/521,740, filed on Jun. 19, 2023, entitled LIGHT PATTERNABLE SURFACE MODIFICATION, the entirety of which is incorporated by reference herein.

BACKGROUND

Field

This invention relates in general to methods of fabricating microelectronic structures.

Description of Related Art

In microelectronic device fabrication, many well-known methods exist for preparing surfaces with high contact angles with water or other solvents. Materials such as those sold under the trade names Rain-X® and Scotchgard™ are readily available, but often fail to provide performance with solvents or offer use for the semiconductor industry. Other materials that have been known to exhibit hydrophobic behavior are derived from silanes, fluorinated compounds, and mixtures thereof. These types of films require complicated processing and must be applied at thicknesses much greater than can be used in semiconductor processes. Another method of modifying the surface to produce hydrophobic/oleophobic properties is through creating surface roughness. A further option is self-assembled monolayers ("SAMs"). However, lengthy and complicated exposure times are required to achieve high contact angles with SAMs. These materials are not normally processed in a track-friendly solvent and would require a custom module for fab-based processing. Standard SAMs are rather limited commercially and are sensitive to substrate contamination and purity. Furthermore, these materials do not allow for photo-patterning.

There is a need for liquiphobic materials that address the foregoing concerns and can be used in the semiconductor manufacturing industry.

SUMMARY

The present disclosure is broadly concerned with a method of forming a structure, the method comprising: (a) providing a substrate having a substrate surface and one or more intermediate layers optionally present on the substrate surface; (b) applying a surface modifying composition to the substrate surface or to an uppermost surface of the top intermediate layer, if present, to form a surface modifying layer, the surface modifying composition comprising a polymer including at least first and second monomers, wherein: the first monomer comprises a surface modifying group; and the second monomer is different from the first monomer and comprises a light-sensitizing group, and wherein the polymer does not include fluorine atoms; (c) selectively exposing the surface modifying layer to light having a wavelength between about 100 nm and about 700 nm to provide light-exposed portions of the surface modifying layer and unexposed portions of the surface modifying layer; and (d) removing the unexposed portions of the surface modifying layer while said light-exposed portions of said surface modifying layer remain on said substrate surface or uppermost surface of said top intermediate layer, if present.

A structure comprising: a substrate having a substrate surface; one or more intermediate layers optionally present on the substrate surface; and a surface modifying layer present on at least a portion of the substrate surface or on an uppermost surface of a top intermediate layer, if present, the surface modifying composition comprising a polymer including at least first and second monomers, wherein: the first monomer comprises a surface modifying group; and the second monomer is different from the first monomer and comprises a light-sensitizing group, and wherein the polymer does not include fluorine atoms.

A method of making a polymer, the method comprising polymerizing the first monomer and the second monomer different from the first monomer to provide a polymer, wherein the polymer is functionalized with at least a surface modifying group and a light-sensitizing group, and wherein: the surface modifying group is chosen from $C_8$ to $C_{36}$ alkyls, octadecylalcohol, octadecylamine, behenyl alcohol, behenyl amine, tridecyl alcohol, tridecyl amine, lauryl alcohol, lauryl amine, or combinations thereof; and the light sensitizing group is chosen from 2-hydroxy-4-methoxybenzophenone, hydroxybenzophenone, aminobenzophenone, 4-benzoylbenzoic acid, 4-(bromomethyl)benzophenone, sodium azide, diazirine, anthracene, compound (I) below, compound (II) below:

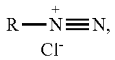

(I)

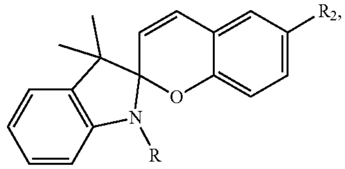

(II)

or combinations thereof.

A polymer comprising at least first and second recurring monomers different from one another, wherein: the first monomer comprises a surface modifying group chosen from $C_8$ to $C_{36}$ alkyls, octadecylalcohol, octadecylamine, behenyl alcohol, behenyl amine, tridecyl alcohol, tridecyl amine, lauryl alcohol, lauryl amine, or combinations thereof; and the second recurring monomer comprises a light sensitizing chosen from 2-hydroxy-4-methoxybenzophenone, hydroxybenzophenone, aminobenzophenone, 4-benzoylbenzoic acid, 4-(bromomethyl)benzophenone, sodium azide, diazirine, anthracene, compound (I) below, compound (II) below:

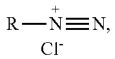

(I)

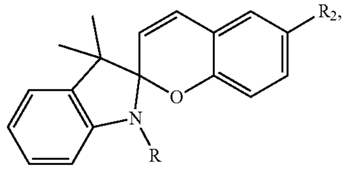

(II)

or combinations thereof.

DETAILED DESCRIPTION

Figure 1:
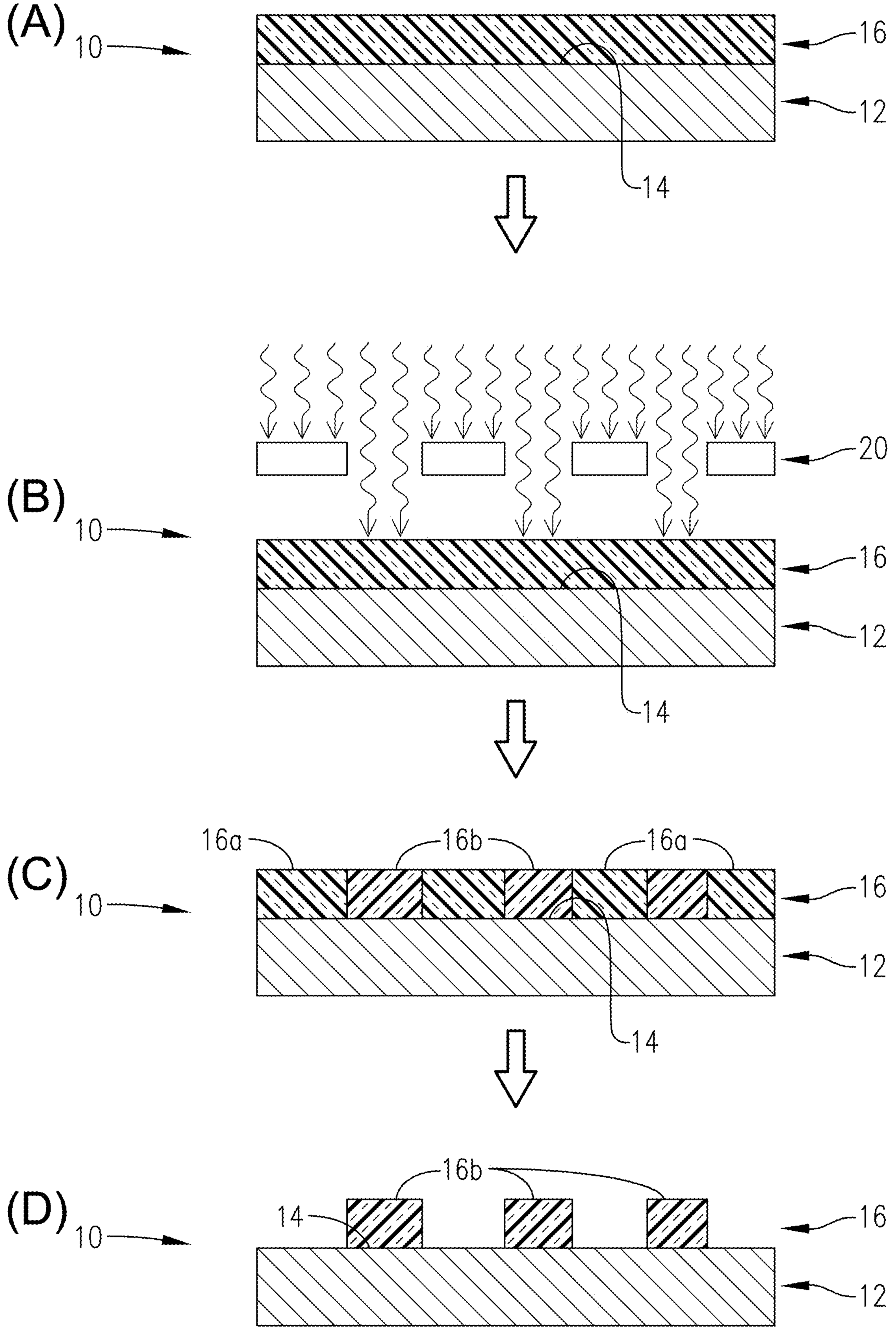
FIG. 1 is a schematic diagram (not to scale) of some embodiments of a method of a surface modification process as described herein.

The present disclosure is broadly concerned with novel compositions for surface modification of substrates, such as those used in the semiconductor industry, and methods for use of such compositions, such as in photolithography applications.

Compositions

1. Polymer

Preferred polymers for use in surface modifications as described herein are polymers of at least two different monomers. These polymers may be generically represented as

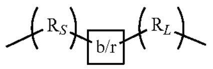

wherein $R_S$ comprises a monomer comprising at least one surface modifying functional group, $R_L$ comprises a monomer comprising at least one light-sensitizing functional group, and "b/r" designates that the polymer could be a block or random copolymer. The $R_S$ and $R_L$ monomers are different from one another.

Each of the $R_S$ and $R_L$ monomers includes a base monomer functionalized with at least one of the functional groups described previously. The $R_S$ and $R_L$ base monomers can be the same or different prior to functionalization and the functionalization may occur before or after polymerization, as discussed in detail below. Examples of suitable base (functionalizable) monomers can include, but are not limited to, monomers including a hydroxyl (—OH), a carboxyl (—COOH), and/or a vinyl group. In some cases, the base monomer may be chosen from 4-chloromethylstyrene, 4-azido methylstyrene, glycidyl methacrylate, methacryloyloxyethyl isocyanate, azidopropyl methacrylate, methacryloyl chloride, or combinations thereof. After functionalization, at least 95%, or 100% of vinyl groups on the base monomer will be reacted.

Preferred $R_S$ monomers can be selected to modify (preferably reduce) the surface energy of the layer or substrate onto which the surface modifying composition is applied. The $R_S$ monomers can include at least one surface modifying group capable of changing the surface energy of the substrate or layer to which it is applied. Preferred surface modifying groups are long chain carbon-containing groups, such as those chosen from $C_8$ to $C_{36}$ alkyls, octadecylalcohol, octadecylamine, behenyl alcohol, behenyl amine, tridecyl alcohol, tridecyl amine, lauryl alcohol, lauryl amine, or combinations thereof. In other cases, the surface modifying group can be chosen from $C_2$ to $C_{36}$ alkyls, $C_4$ to $C_{36}$ alkyls, or $C_6$ to $C_{36}$ alkyls, or $C_{10}$ to $C_{32}$ alkyls, $C_{12}$ to $C_{30}$ alkyls, or $C_{18}$ to $C_{28}$ alkyls. In one embodiment, the surface modifying group is a pendant from the polymer backbone.

The $R_S$ monomer can be present in the final polymer in an amount of from about 1% to about 99% by weight, about 10% to about 95% by weight, about 75% to about 95% by weight, or about 80% to about 95% by weight, based on the total weight of the polymer taken as 100%. Additionally, or in the alternative, the $R_S$ monomer can be present in the final polymer in an amount of from about 1 mol % to about 99 mol %, about 10 mol % to about 95 mol %, about 55 mol % to about 95 mol %, or about 65 mol % to about 85 mol %, based on the total moles of monomer making up the polymer taken as 100%.

$R_L$ monomers are preferably selected to give the polymer light sensitivity in a manner such that the polymer can graft and or react to a substrate selectively in regions where it is exposed. The $R_L$ monomers can include at least one light sensitizing group capable of altering (preferably increasing) the photosensitivity and or photo-reactivity of the polymer or surface modifying composition. Photosensitivity (or light sensitivity or photo-reactivity) means that the layer (or composition) undergoes a physical and/or chemical change upon exposure to light that results in the polymer reacting to or adhering to the exposed surface. More specifically, if a layer (or composition) is photosensitive (or light sensitive), a pattern can be defined therein when exposed to light at a dose of about 10 mJ/cm$^2$ or greater. For example, photosensitive (or photoreactive) materials may form a pattern when exposed to light at a dose of about 100 mJ/cm$^2$ or greater, or about 150 mJ/cm$^2$ or greater or about 200 mJ/cm$^2$ or greater at a wavelength of from about 100 nm to about 700 nm, about 100 nm to about nm 500, about 250 nm to about 500 nm, or about 200 nm to about 400 nm.

In some embodiments, addition of a light sensitizing group to a given monomer increases its light sensitivity by at least about 10%, at least about 20%, at least about 25%, or at least about 30%, as compared to an identical monomer without the light sensitizing group. In some cases, the increase in light sensitivity by way of addition of the light sensitizing group can be in the range of from about 5% to about 95%, about 10% to about 75%, about 15% to about 65%, or about 20% to about 45%, as compared to an identical monomer without the light sensitizing group.

Preferred light sensitizing groups are nucleophilic and may include azides or benzophenone derivatives. Light sensitizing groups can be chosen from 2-hydroxy-4-methoxybenzophenone, hydroxybenzophenone, aminobenzophenone, 4-benzoylbenzoic acid, 4-(bromomethyl)benzophenone, sodium azide, diazirine, anthracene, compound (I) below, compound (II) below, or derivatives thereof, or combination thereof:

(I)

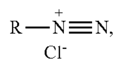

(II)

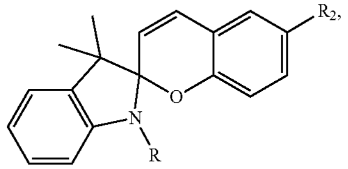

In one preferred embodiment, the light sensitizing group is a pendant from the polymer backbone.

The $R_L$ monomer can be present in the final polymer in an amount of from about 0.1% to about 30% by weight, about 1% to about 25% by weight, about 5% to about 20%, or about 10% to about 15% by weight, based on the total weight of the polymer taken as 100%. Additionally, or alternatively, the $R_L$ monomer can be present in the final polymer in an amount of from about 0.1 mol % to about 50 mol %, about 5 mol % to about 40 mol %, about 10 mol % to about 35 mol %, or about 20 mol % to about 30 mol %, based on the total moles of monomer making up the polymer taken as 100%.

In some embodiments, the weight ratio of $R_S$ monomers to $R_L$ monomers in the final polymer can be about 1000:1 to about 0.03:1, about 20:1 to about 2:1, or about 10:1 to about 2:1, or about 5:1 to about 2:1. Additionally, or alternatively, the molar ratio of $R_S$ monomers to $R_L$ monomers in the final polymer can be about 1000:1 to about 0.02:1, about 20:1 to about 0.2:1, or about 10:1 to about 2:1. In some embodiments, the polymer can include three or more different monomers. For example, a third monomer may be included in the polymer. These polymers can be generically represented as

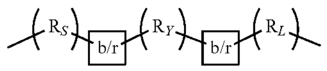

wherein $R_Y$ is a solubility enhancing monomer, and $R_S$, $R_L$, and "b/r" are defined previously.

Preferred $R_Y$ monomers comprise functionalities that have a high solubility in solvents suitable for the particular use, thus improving the solubility of the resulting polymer in such solvents. In some embodiments, the $R_Y$ monomers are selected to have high solubility in solvents commonly used in the semiconductor industry (e.g., propylene glycol methyl ether ("PGME"), propylene glycol methyl ether acetate ("PGMEA"), ethyl lactate, cyclohexanone). As used herein, the term "high solubility" refers to monomers that when incorporated into the polymer at about 25 weight percent cause the polymer to dissolve in 100% PGMEA at a concentration of 1% by weight under stirring in 10 minutes at 22° C.

Preferred solubility enhancing monomers include styrene, methyl methacrylate, methylstyrene, 4-tert-butylstyrene, n-butyl methacrylate, benzyl methacrylate, tert-butyl methacrylate, polyethylene glycol methacrylate or combinations thereof.

In embodiments where one or more $R_Y$ monomers are included, such monomers may be present in an amount of up to about 99.5% by weight, or from about 1% to about 40% by weight, or from about 5% to about 30% by weight, or from about 10% to about 20% by weight, based on weight of the polymer taken as 100%. Additionally, or alternatively, the polymer may include $R_Y$ monomers in an amount of from about 1 mol % to about 99.5 mol %, about 5 mol % to about 30 mol %, or about 10 mol % to about 20 mol %, based on the total moles of the monomers making up the polymer taken as 100%. In some embodiments, the $R_Y$ monomers may not be functionalized or functionalizable.

Two preferred polymers for use as described herein are provided below:

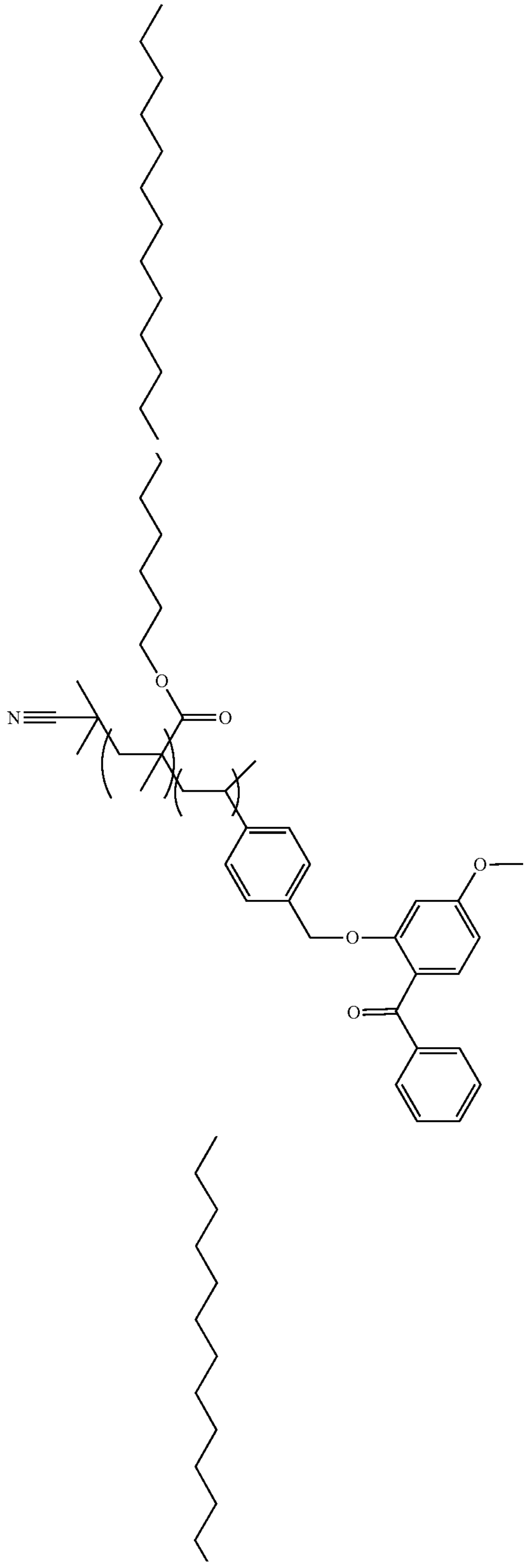

-continued

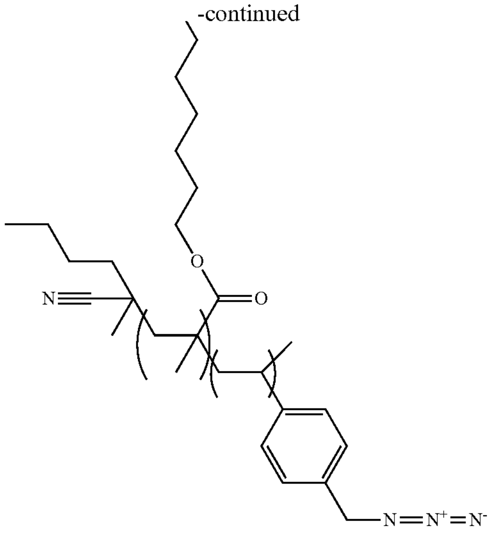

2. Polymer Synthesis

As mentioned previously, the surface modifying and light sensitizing functionalizations can be added to the polymer before or after its polymerization. That is, in some embodiments, one or more non-functionalized monomers (e.g., base monomers) can be polymerized to form a base polymer, which can then be functionalized to include surface modifying and/or light sensitizing groups as described herein. In other embodiments, at least one base monomer is functionalized with a surface modifying and/or light sensitizing group and then polymerized with another monomer (functionalized or not) to form an at least partially (or fully) functionalized polymer. When one of the monomers is not functionalized before polymerization, the resulting polymer can be functionalized to add the desired group (e.g., surface modifying or light sensitizing). In some cases, both monomers can be functionalized prior to polymerization.

When one or more non-functionalized (base) monomers are used to prepare a base polymer that is then functionalized, one or more base monomers (optionally with one or more solubility enhancing monomers) described herein may be combined and polymerized to form the base polymer or copolymer. This polymerization step can be carried out according to the methods described herein.

In some embodiments, the non-functionalized (base) monomer or monomers may be present in the polymerization reaction solution in an amount of from about 0.5 mol % to about 99 mol %, about 60 mol % to about 99 mol %, about 65 mol % to about 95 mol %, or about 70 mol % to about 90 mol %, based on the total moles of monomers added to the polymerization mixture, while in other cases the base monomer or monomers may be the only monomers added to the polymerization mixture.

Similarly, when used, the solubility enhancing monomers may be present in an amount of from about 1 mol % to about 99.5 mol %, about 1 mol % to about 40 mol %, or from about 5 mol % to about 30 mol %, or from about 10 mol % to about 20 mol %, based on the total moles of monomers making up the polymer taken as 100%.

After completion of the polymerization reaction, the polymer can be diluted in the polymerization solvent and precipitated in an antisolvent such as acetone, methanol, water, other alcohol, or combinations thereof. The isolated polymer is then redissolved in a suitable solvent and precipitated again in the antisolvent to purify the base polymer.

The resulting isolated base polymer can then be functionalized by reacting that base polymer with compounds that add the desired light sensitizing and/or surface modifying functional groups to the polymer (if needed). Examples of each are described herein. In some embodiments, the base polymer can be functionalized with both the light sensitizing group and the surface modifying groups at the same time, while in other cases, the two functional groups may be added sequentially. Alternatively, one or more of the base monomers described herein can be subjected to a functionalization reaction and then polymerized to form the final polymer.

Functionalization can be carried out by combining the isolated base polymer (or at least one base monomer in the case of monomer pre-functionalization) with a compound including the desired functional groups, as well as a solvent and, in some cases, a base and/or catalyst. These components can be combined in a flask equipped with a nitrogen purge and a water condenser. The functionalization reaction proceeds at a temperature of from about 50° C. to about 130° C., about 55° C. to about 120° C., or about 60° C. to about 110° C. for a time of from about 1 minute to about 100 hours, about 12 hours to about 90 hours, or about 24 hours to about 72 hours.

The polymer (or monomer) may be present in the functionalization reaction solution in an amount of from about 10% to about 40% by weight, about 12% to about 35% by weight, or about 15% to about 20% by weight. The compound providing the light sensitizing group can be present in the functionalization reaction solution in an amount of from about 1% to about 30% by weight, about 1.5% to about 15% by weight, or about 2% to about 10% by weight. Additionally, the compound providing the surface modifying group can be present in the functionalization reaction solution in an amount of from about 0.1% to about 50% by weight, about 0.5% to about 25% by weight, or about 1% to about 10% by weight. Each of these percentages are based on the total weight of the functionalization reaction solution taken as 100%.

In some embodiments, particularly when functionalizing the polymer or monomer with a surface modifying group, the reaction solution can comprise a base and a catalyst. When the light sensitizing group is being added to a polymer or monomer, in some cases, no base or catalyst may be present.

Suitable bases for use in the functionalization step (when used) can be chosen from potassium carbonate, cesium carbonate, or combinations thereof. The base may be present in the functionalization reaction solution in an amount of from about 1% to about 10% by weight, about 1.5% to about 7.5% by weight, or about 2% to about 5% by weight, based on the total weight of the functionalization reaction solution taken as 100%.

Suitable catalysts for use in the functionalization step (when used) can include tetrabutyl ammonium iodide, potassium iodide, or combinations thereof. The catalyst can be present in the functionalization reaction solution in an amount of from about 0.01% to about 1% by weight, or about 0.05% to about 0.5% by weight, based on the total weight of the functionalization reaction solution taken as 100%.

Suitable functionalization solvents can include, but are not limited to, bicyclohexyl, acetonitrile, cyclohexyl benzene, MIBK, PGMEA, or combinations thereof. The polymerization solvent is present in the functionalization reaction solution in an amount of from about 10% to about 70%, about 15% to about 45%, or about 20% to about 30%, based on the total weight of the functionalization reaction solution taken as 100%.

Regardless of when functionalization occurs, polymers as described herein may be prepared by free radical polymerization. For random copolymers, the monomers and an initiator are mixed with a solvent in a flask equipped with nitrogen purging and a water condenser. Polymerization proceeds at temperatures from about 50° C. to about 150° C., about 60° C. to about 110° C., or about 85° C. to about 105° C., for a time of from about 2 hours to about 24 hours, about 6 hours to about 18 hours, or about 8 hours to about 12 hours.

For block copolymers (BCP), the reaction may proceed in three steps. In the first step, a chain transfer agent such as 4-cyano-4-[(dodecylsulfanylthiocarbonyl) sulfanyl]pentanoic acid), an initiator such as 2,2'-azobis(2-methylpropionitrile) (AIBN), the $R_S$ monomer, and one or more solvents are preferably mixed in a flask equipped with $N_2$ purging and a water condenser. The reaction is allowed to proceed at a temperature of from about 50° C. to about 150° C., about 60° C. to about 110° C., or about 85° C. to about 105° C. The temperature of the reaction mixture may be controlled by immersing the flask in an oil bath. Polymerization can proceed for from about 1 hours to about 4 hours, or for about 2 hours.

In the next step, an $N_2$-purged mixture of the $R_Y$ monomer, initiator, and solvent is added to the flask and preferably purged with $N_2$ via a syringe needle and a purge outlet needle. The polymerization is allowed to proceed for from about 2 hours to about 16 hours, or from about 5 hours to about 10 hours. In some cases, polymers are precipitated to remove monomer residues before moving to the third step.

In the third step, an $N_2$-purged mixture of $R_L$ monomer, initiator, and solvent is added to the flask and purged with $N_2$ via a syringe needle and a purge outlet needle. Polymerization is allowed to proceed from about 2 hours to about 24 hours, or from about 4 hours to about 16 hours. The final polymer solution is then purified by precipitation and vacuum dried. The dry BCP is then re-dissolved in appropriate solvent (such as MIBK) to prepare mother liquors or formulations.

Suitable initiators for use in the polymerization reaction include 2,2'-azobis(2-methylpropionitrile) ("AIBN"), 2,2'-azodi (2-methylbutyronitrilc) ("AMBN," such as that sold under the name Vazo™ 67 by Chemours), Vazo™ 52, Vazo™ 68 WSP, 4,4'-azobis(4-cyanovaleric acid), dicumyl peroxide, or combinations thereof. The initiator may be present in the reaction mixture in an amount of from 0.2% to about 5%, or from about 0.5% to about 2%, as a percentage of the weight of the monomers in the reaction solution taken as 100%.

Suitable polymerization solvents include, but are not limited to, propylene glycol methyl ether (PGME), propylene glycol methyl ether acetate (PGMEA), cyclohexanone, 4-methyl-2-pentanone (MIBK), dimethylacetamide (DMAc), cyclohexyl benzene, bicyclohexyl, or combinations thereof. The polymerization solvent can be present in the reaction solution in an amount of from about 0% to about 80% by weight, from about 10% to about 50% by weight, from about 15% to about 40% by weight, or from about 20% to about 30% by weight, with the total weight of the reaction solution taken as 100%.

The monomers (including any functionalized or functionalizable monomer or monomers and any comonomer or comonomers) are present in the reaction solution in an amount of from about 15% to about 99.9% by weight, about 35 to about 90% by weight, or about 65% to about 85% by weight, with the total weight of the reaction solution taken as 100%.

After completion of the functionalization reaction, the functionalized polymer (or monomer) is dissolved in a solvent including, for example, hexane, cyclohexylbenzene, bicyclohexyl, and combinations thereof. The precipitated polymer (or monomer) may then be precipitated in an antisolvent such as acetone, methanol, water, alcohol, or combinations thereof. The isolated polymer (or monomer) may then be redissolved in a suitable solvent and precipitated again in the antisolvent to purify the final polymer (or monomer).

The weight-average molecular weight (Mw) of the final polymer (as measured by gel permeation chromatography) can be from about 500 g/mol to about 500,000 g/mol, about 1,000 g/mol to about 20,000 g/mol, about 3,000 g/mol to about 20,000 gm/mol, or about 5,000 g/mol to about 10,000 g/mol.

In some embodiments, the polymer consists essentially of, or even consists of, $R_S$ and $R_L$ monomers. In another embodiment, the polymer consists essentially of, or even consists of, $R_S$, $R_L$, and $R_Y$ monomers. Thus, the polymer may include less than about 1% by weight, less than about 0.5% by weight, less than about 0.1% by weight, or 0% by weight, based on the total weight of the polymer taken as 100%, of monomers other than $R_S$ and $R_L$ or other than $R_S$, $R_L$, and $R_Y$. In some embodiments, monomers other than the $R_S$ and $R_L$ or other than $R_S$, $R_L$, and $R_Y$ may be present in the final polymer.

In some embodiments, the polymer includes little to no fluorine atoms. In such embodiments, the polymer comprises less than about 1% by weight, less than about 0.5% by weight, less than about 0.1% by weight, or 0% by weight, based on the total weight of the polymer taken as 100%, of fluorine (F) atoms and/or monomers including fluorine atoms.

In some embodiments, the polymer includes little to no silicon atoms. In these embodiments, the polymer comprises less than about 1% by weight, less than about 0.5% by weight, less than about 0.1% by weight, or 0% by weight, based on the total weight of the polymer taken as 100%, of silicon atoms (Si) and/or monomers including silicon atoms.

3. Inventive Compositions

Surface modifying compositions according to embodiments of the present technology include the above-described polymer dispersed or dissolved in a solvent system. The composition may contain additional ingredients, such as those chosen from crosslinkers, surfactants, additional polymers (i.e., a polymer different from the one previously described), catalysts, additives, or combinations thereof. In some embodiments, the surface modifying compositions can consist essentially of, or even consist of, the polymer dispersed or dissolved in a solvent system. In other embodiments, the surface modifying compositions consist essentially of, or even consist of, the polymer dispersed or dissolved in a solvent system, along with one or more of a crosslinker, a surfactant, an additional polymer, a catalyst, an additive, or combinations thereof.

In some embodiments, the composition (or layer formed therefrom) comprises less than about 5% by weight, less than about 1% by weight, or about 0% by weight of silicon and/or silicon-containing compounds, based upon the total weight of solids in the composition taken as 100%.

In some embodiments, the composition (or layer formed therefrom) comprises less than about 5% by weight, less than about 1% by weight, or less than about 0% by weight of nanoparticles, based upon the total weight of solids in the composition taken as 100%.

In some embodiments, the composition (or layer formed therefrom) comprises less than about 5% by weight, less than about 1% by weight, and/or less than about 0% by weight of fluorine atoms or fluorine-containing compounds, based upon the total weight of solids in the composition taken as 100%.

In some embodiments, the polymer can be present in the surface modifying composition in an amount from about 0.01% to about 5% by weight solids, about 0.2% to about 2% by weight solids, about 0.1% to about 10% by weight solids, or about 0.5 to about 5% by weight solids, based upon the total weight of the composition taken as 100% by weight.

Preferred solvent systems include one or more solvents, such as those selected from the group consisting of cyclohexylbenzene, PGME, MIBK, MEK, n-butyl acetate, PGMEA, DMAc, ethyl lactate (EL), cyclohexanone, gamma butyrolactone (GBL), propylene glycol ethyl ether (PGEE), bicyclohexyl, and mixtures thereof. The solvent system can have a boiling point of from about 100° C. to about 250° C., about 130° C. or about 180° C. The solvent system can be utilized at a level of from about 95% to about 99.99% by weight or from about 98% to about 99.8% by weight, based upon the total weight of the composition taken as 100% by weight.

Mixing the above ingredients together in the solvent system forms the particular composition. Furthermore, any optional ingredients (e.g., surfactants) can also be dispersed in the solvent system at the same time. The material is preferably filtered before use, such as with a 0.1-μm or 0.2-μm PTFE filter.

Methods of Using Surface Modifying Compositions

A method of using a surface modifying composition according to embodiments of the present technology is provided. Referring to FIG. 1(A), a stack 10 is schematically depicted. Stack 10 comprises a substrate 12 having a surface 14.

Substrate 12 can be any suitable type of microelectronic substrate, and preferably is a semiconductor substrate. Exemplary types of substrates may be chosen from silicon, SiGe, $SiO_2$, $Si_3N_4$, SiON, SiCO:H (such as that sold under the name Black Diamond, by SVM, Santa Clara, CA, US), tetramethyl silate and tetramethyl-cyclotetrasiloxane combinations (such as that sold under the name CORAL), aluminum, tungsten, tungsten silicide, gallium arsenide, germanium, tantalum, tantalum nitride, $Ti_3N_4$, hafnium, $HfO_2$, ruthenium, indium phosphide, glass, or combinations of the foregoing. In some embodiments, the substrate 14 is not a nanofiber and in some embodiments, the substrate 12 may not include microneedles (similar to a lotus leaf) on its surface 14.

Optional intermediate layers (not shown) may also be formed on the surface 14 of substrate 12 prior to processing. Examples of optional intermediate layers include, but are not limited to, silicon, silicon dioxide, silicon carbide, silicon nitride, silicon oxynitride, metals (including TiN and/or tungsten), carbon (including carbon fiber, carbon nanofibers, carbon nanotubes, diamond, and/or graphene), fluorocarbons, filaments, and high-k dielectrics. One or more, or none, of these intermediate layers may be present on the surface 14 of substrate 12.

In some embodiments, the surface 14 of substrate 12 (or one or more surfaces of the optional intermediate layers, when present) may be planar or one or more of the surfaces may have topographic features (e.g., via holes, trenches, contact holes, raised features, lines, etc.). In general, the term “topography” or “topographical” refers to the height of depth of a structure in or on a substrate (or layer) surface.

As shown in FIG. 1(A), a surface modifying composition as described above may be applied to the surface 14 of the substrate 12 (or to the uppermost surface of the top intermediate layer, when present) to provide a surface modifying layer 16. The composition can be applied by any suitable method including, for example, by spin coating the composition at speeds in the range of from about 500 rpm to about 3000 rpm or about 1000 rpm to about 2000 rpm for a time period of about 15 seconds to about 300 seconds, about 20 seconds to about 90 seconds, or about 25 seconds to about 60 seconds.

As shown in FIG. 1(A), the surface modifying composition may be applied so that the layer 16 covers at least about 75%, at least about 85%, at least about 90%, at least about 95%, or at least about 99% of the surface 14 of the substrate 12 or intermediate layer, if present, onto which it is coated. In some embodiments, the surface modifying layer 16 can cover the entire surface 14 of the substrate 12 (or layer) to which it is applied. Thus, in some embodiments, there is no selective coating of the surface modifying composition such that the surface modifying layer is not selectively applied.

Optionally, the surface modifying composition may be baked. When a bake step is used, the baking conditions can include a temperature of about 40° C. to about 300° C., about 60° C. to about 200° C., or about 80° C. to about 120° C. and a time period of about 15 seconds to about 300 seconds, about 20 seconds to about 90 seconds, or about 25 seconds to about 60 seconds. Preferably, no bake step is used. The average thickness of the surface modifying layer 16 can be in the range of from about 1 nm to about 30 nm, about 2 nm to about 15 nm, or about 5 nm to about 10 nm.

Regardless, the final surface modifying layer 16 will have a different surface energy (preferably lower) than the surface energy of the surface 14 of the substrate 12 (or optional intermediate layer) on which it was formed. For example, the final surface modifying layer 16 (after any exposure/baking steps (e.g., as described below) are complete) can have a surface energy that from about 5% to about 95%, about 10% to about 65%, about 15% to about 50%, or about 20% to about 45% different (e.g., lower) than the surface energy of the surface 14 of the substrate 12 (or optional intermediate layer) on which it was formed. In some embodiments, the final surface modifying layer 16 can have a surface energy that is at least about 5%, at least about 10%, at least about 15%, at least about 20%, or at least about 25% different (e.g., lower) than the surface energy of the surface 14 of the substrate 12 (or optional intermediate layer) on which it was formed. The surface energy is determined by finding the water contact angle or PGME contact angle, as described previously.

In some embodiments, the surface modifying layer 16 may have a static water contact angle of greater than about 80°, greater than about 90°, greater than about 95°, or greater than 100°. Thus, the surface modifying layer 16 can be hydrophobic. In some embodiments, the surface modifying layer 16 can have a PGMEA static contact angle of greater than about 40°, greater than about 45°, greater than about 50°, or greater than about 55°. Thus, the surface modifying layer 16 may be oleophobic. The contact angles referred to above for water and PGMEA both refer to the surface after all exposure and baking steps (e.g., as described below) are complete. The static contact angle is measured using a VCA Optima system (commercially available from AST Products of Billerica, MA) and a 0.5 μL droplet.

Referring now to FIG. 1(B), the surface modifying layer 16 may be patterned by exposure to radiation (light or energy) having a wavelength between about 100 nm and about 700 nm, about 250 nm and about 500 nm, about 300 to about 450 nm, or about 300 to about 350 nm. The total dose of energy provided during the irradiation step can be from about 1 $mJ/cm^2$ to about 600 $J/cm^2$, about 30 $mJ/cm^2$ to about 400 $mJ/cm^2$, about 40 $mJ/cm^2$ to about 300 $mJ/cm^2$ or about 100 $mJ/cm^2$ to about 250 $mJ/cm^2$.

As shown in FIG. 1(B), the exposure of surface modifying layer 16 can be selectively done by, for example, use of a photomask 20 positioned above the surface of the surface modifying layer 16. The photomask 20 has areas designed to permit the radiation to pass through and contact the surface modifying layer 16 and other areas designed to absorb the radiation to prevent it from contacting the surface modifying layer 16. The arrangement of these areas of the photomask 20 is based upon the desired patterns to be formed in the surface modifying layer 16.

During the irradiation step, at least one of the surface modifying group and the light sensitizing group of the polymer may chemically bond and/or physically attach to the surface 14 of substrate 12 (or uppermost surface of the top intermediate layer, if present). Thus, the polymers can be grafted where light has been exposed. The result is formation of light-exposed portions 16*b* and unexposed portions 16*a* of the surface modifying layer 16, as shown in FIG. 1(C). In one preferred embodiment, the surface modifying layer does not crosslink with itself during the exposure step.

Further, in some embodiments, no separate photoresist layer is required to perform light patterning as described herein. Instead, it is the surface modifying layer 16 that is exposed to radiation and developed to form a pattern, not a photoresist layer. Thus, the surface modifying layer 16 is not adjacent to a photoresist layer in some embodiments. Moreover, the direct patterning of the surface modifying layer 16 distinguishes it from other layers, such as polymer brush layers, that may be present in various microelectronic stacks but that would not undergo direct patterning. Thus, the surface modification layer 16 is also not a polymer brush layer.

After exposure, the surface modifying layer 16 is optionally subjected to a post-exposure bake (PEB) at a temperature of about 50° C. to about 250° C., about 70° C. to about 200° C., or about 80° C. to about 150° C., for a time period of about 10 seconds to about 300 seconds or about 15 seconds to about 60 seconds. In one preferred embodiment, the surface modifying layer does not crosslink with itself during the post-exposure bake step.

The surface modifying layer 16 is then contacted with a solvent to form a pattern by dissolving away the unexposed portions 16*a*, while the exposed portions 16*b* (which are grafted to the surface 12) remain, as shown in FIG. 1(D). In some embodiments, a solvent puddle is optionally performed for about 10 seconds to about 120 seconds, about 20 seconds to about 90 seconds, or about 50 seconds to about 60 seconds. Suitable solvents used in this step include, but are not limited to, MIBK, cyclohexanone, bicyclohexyl, hexanes, or combinations thereof.

The substrate is then dried, e.g. by spinning at speeds from about 1,000 rpm to about 4,000 rpm, or about 1,500 rpm to about 3,000 rpm, for a time period of from about 10 seconds to about 300 seconds, or about 30 seconds to about 60 seconds. This process may be repeated as necessary to remove any excess surface modifying material. The remaining surface modifying layer can then be baked again. Preferred baking conditions can involve temperatures from about 25° C. to about 200° C., about 35° C. to about 180° C., or about 60° C. to about 160° C. and for a time period of from about 10 seconds to about 300 seconds, about 15 seconds to about 120 seconds, or about 30 seconds to about 60 seconds.

After the removing step, only a portion of the original surface (e.g., substrate surface 14 or the uppermost surface of the top intermediate layer, if present) is coated with the surface modifying layer and a portion of the original surface is again exposed. The remaining light-exposed portions 16*b* of the surface modifying layer 16 can optionally be subjected to an additional bake step at a temperature of about 50° C. to about 250° C., about 65° C. to about 200° C., or about 80° C. to about 150° C. for a time period of about 10 seconds to about 300 seconds or about 15 seconds to about 60 seconds. Preferably, no additional bake step is used.

After patterning, the remaining exposed portions 16*b* of the surface energy modifying layer can have a thickness of from about 1 nm to about 50 nm, about 2 nm to about 25 nm, or about 5 nm to about 10 nm. The water contact angle and the PGMEA contact angle of the exposed portions 16*b* may be within the ranges described herein.

The application and patterning steps performed on the surface modifying layer 16 process may be repeated to form additional or different patterns. In other embodiments, a photoresist or other associate layers may be applied on top of the patterned surface modifying layer. In some embodiments, the surface modifying material is only dispensed at the edge of a microelectronic substrate. In this embodiment, the surface modifying layer may serve as an edge mask to keep subsequently spin-coated materials from adhering to the surface of the substrate.

The remaining surface modifying layer (e.g., exposed portions 16*b* shown in FIG. 1(D)) will exhibit the oleophobic or hydrophobic properties of the polymer. This pattern may be used for further applications to enable selective deposition. For example, such layers be used to enable selective deposition schemes of other chemistries, such as biomolecule deposition or deposition of other materials that aid in patterning. Furthermore, the patterns may be useful for fluid, reagent, or analyte gating applications in lab-on-a-chip. Such patterning may also be used in chip placement and alignment in packaging applications. The material and methods described herein may also be used in edge protection applications, e.g., for metal hard masks.

Additional advantages of the various embodiments of the invention will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present invention encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Synthesis of Precursor Polymer poly(vinylbenzylchloride-co-stearyl methacrylate)

In a 250-ml glass round bottom flask equipped with a septa cap and a magnetic stir bar, 29.7 grams of melted stearyl methacrylate (TCI America, OR), 4.4 grams of 4-chloromethylstyrene (TCI America), 0.18 gram of VAZO67 initiator (The Chemours Company FC, LLC, DE) and 10 grams of MIBK (Alfa Acsar, MA) as solvent were added. The reaction mixture was purged using a rubber septa an inlet needle for bubbling nitrogen and an outlet for gas, for 5 minutes. The reaction mixture was heated to 100° C. for 5 hours. After polymerization, the polymer was purified by precipitating in acetone re-dissolving in 10 milliliters of hexane (Sigma-Aldrich Inc, MO) and precipitated in 100 milliliters of acetone (Sigma-Aldrich Inc, MO), and repeating the precipitation process. This polymer was used in the functionalization steps described in the following examples.

Example 2

Synthesis of Functionalized polymer poly({2-[(p-Isopropenylphenyl) methoxy]-4-methoxyphenyl}phenylmethanone-co-stearyl methacrylate)

In a 100-ml round bottom flask, 1.49 grams of polymer from Example 1 were heated to 75° C. to dissolve in 10 grams of bicyclohexyl (TCI America, OR). 1.28 grams of 2-hydroxy-4-methoxybenzophenone (Sigma-Aldrich Inc, MO), 0.037 gram of tetrabutyl ammonium iodide (Sigma-Aldrich Inc, MO), 0.77 gram of potassium carbonate (Sigma-Aldrich Inc, MO) and 9.89 grams of acetonitrile (Sigma-Aldrich Inc, MO) were added, and the mixture was set to reflux at 100° C. The reaction was fitted with a condenser and a nitrogen blanket. The reaction was run at 100° C. for approximately 72 hours. After the reaction mixture was cooled to room temperature, 150 milliliters of water were added to the reaction mixture and the top bicyclohexyl layer was collected. This layer was precipitated in 100 milliliters of acetone (Fujifilm Ultra Pure Solutions, Inc., CA). The solids were re-dissolved in 10 milliliters of hexane (Sigma-Aldrich Inc, MO) and precipitated in 100 milliliters of methanol (Sigma-Aldrich Inc, MO) and 1-2 milliliters of acetone were also added to reduce immiscibility. The solvents were decanted and pale yellow polymer solids were obtained and used in further formulations.

Example 3

Formulation in Cyclohexylbenzene of Polymer Synthesized in Example 2

In a 20-ml scintillation vial, 0.1 gram of polymer solids from Example 2 were weighed and 9.9 grams of cyclohexylbenzene (Alfa Acesar, MA) were added. The vial was mixed until all contents were dissolved. The formulation was then used for further tests.

Example 4

Formulation in PGMEA of Polymer Synthesized in Example 2

In a 20-ml scintillation vial, 0.1 gram of polymer solids from Example 2 were weighed and 9.9 grams of PGMEA (Fujifilm Ultra Pure Solutions, Inc., CA)) were added. The vial was mixed until all contents were miscible. The formulation was then used for further tests.

Example 5

Synthesis of Functionalized polymer poly(2-(vinylbenzylazide-co-stearyl methacrylate))

Figure 2:
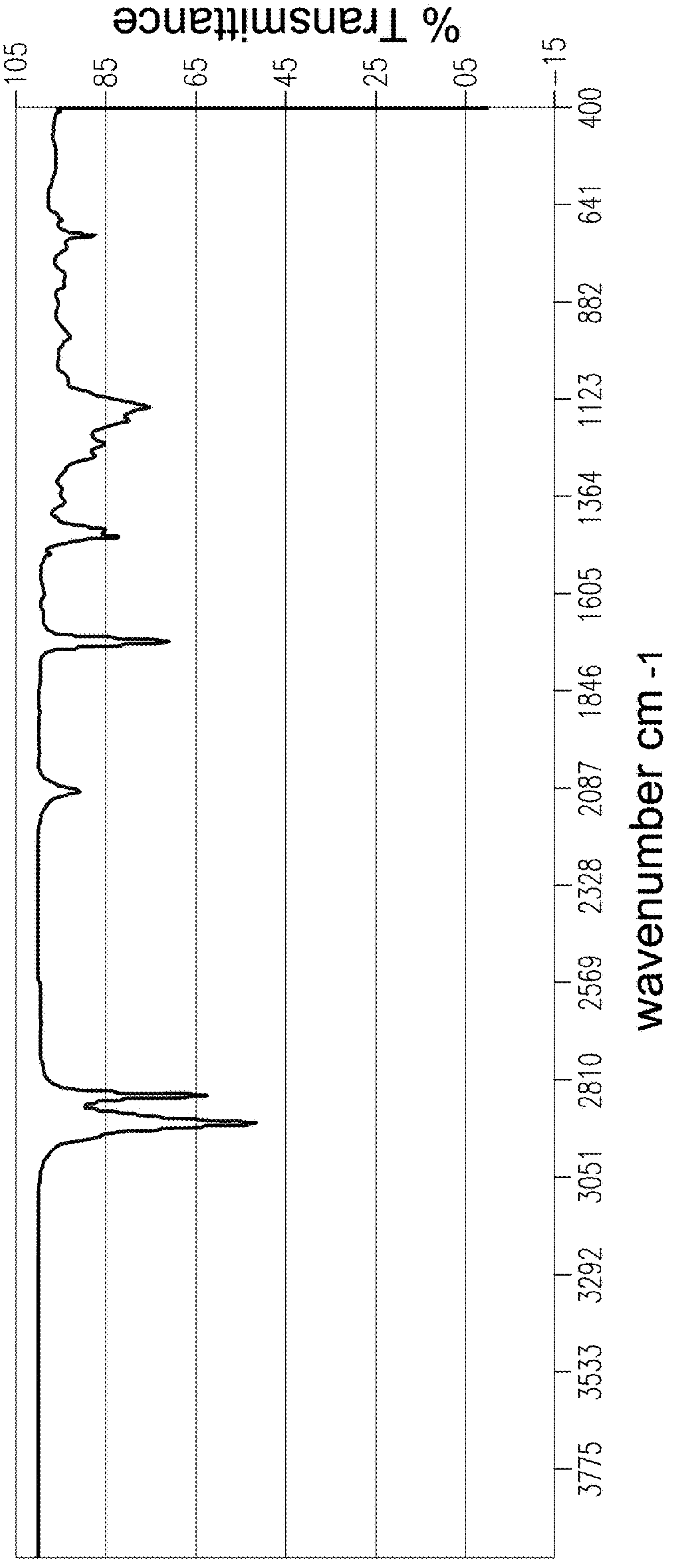
FIG. 2 is a Fourier-Transform infrared spectroscopy (FTIR) spectra of the polymer formed in Example 5.

In a 250-ml glass round bottom flask equipped with a septa cap and a magnetic stir bar, 1.07 gram of polymer from Example 1 was dissolved in 15 grams of bicyclohexyl by heating to 75° C. To this solution, 2.18 grams of sodium azide (Sigma-Aldrich Inc, MO), 0.05 grams of tetrabutylammonium iodide, and 9.97 grams of acetonitrile were added. This biphasic mixture was refluxed at 100° C. for approximately 72 hours. After the reaction was cooled to room temperature, 250 milliliters of deionized water were added to the biphasic mixture and the bicyclohexyl layer was separated with a pipette. Five milliliters of hexane were added to this layer to dilute. This solution was precipitated in 150 grams of acetone. The solids were redissolved in 15 grams of hexane and precipitated in 150 grams of methanol. The solvents were decanted, and white solids were collected for further use in formulations. The appearance of peak at 2095 $cm^{-1}$ in FTIR spectra supports incorporation of an azide into the polymer backbone. The FTIR spectrum of the polymer is provided in FIG. 2.

Example 6

Formulation in Cyclohexylbenzene of Polymer Synthesized in Example 5

In a 20-ml scintillation vial, 0.1 gram of polymer solids from Example 5 was weighed and 9.9 grams of cyclohexylbenzene was added. The vial was mixed until all contents were miscible. The formulation was then used for further tests.

Example 7

Formulation in PGMEA of Polymer Synthesized in Example 5

In a 20-ml scintillation vial, 0.1 gram of polymer solids from Example 5 was weighed and 9.9 grams of PGMEA was added. The vial was mixed until all contents were miscible. The formulation was then used for further tests.

Example 8

Light-Responsive Patterning and Grafting to Silicon Substrate with Formulations from Examples 3, 4, 6 and 7

On four separate 4" silicon reclaimed wafers, the formulations from Examples 3, 4, 6 and 7 were spin coated at 1500 rpm for 60 seconds. Half of these wafers were covered with another silicon wafer that was cut in half as a light blocking mask. This wafer setup was exposed to UV radiation on an Intelli-ray 600 UV exposure tool for 60 seconds at 100% intensity corresponding to a dose of 10.3 J/cm$^2$. The mask was removed, and the wafer was rinsed with MIBK three times after puddling with the MIBK solvent for 20 seconds. Finally, water contact angles were measured on the exposed and unexposed areas of the wafers. The water contact angle measurements are reported in Table 1.

TABLE 1

Water contact angles (CA) of coated and exposed wafers

| Example Formulation | Water CA (°) Exposed | Water CA (°) Unexposed |
|---|---|---|
| 3 | 103 | 35 |
| 4 | 101 | 29 |
| 6 | 106 | 35 |
| 7 | 40 | 33 |

Example 9

Synthesis of Functionalized polymer poly({2-[(p-Isopropenylphenyl)methoxy]-4-methoxyphenyl}phenylmethanone-co-stearyl methacrylate)

In a 250 ml round bottom flask, 8.99 grams of polymer from Example 1, 15.1 grams of bicyclohexyl, 5.99 grams of 2-hydroxy-4-methoxybenzophenone, 0.19 gram of tetrabutyl ammonium iodide, 4.06 gram of potassium carbonate, and 16.23 grams of acetonitrile were added, and the mixture was set to reflux at 100° C. The reaction was fitted with a condenser and a nitrogen blanket. The reaction was run at 100° C. for 4254 minutes. After the reaction mixture was cooled to room temperature, 150 milliliters of water were added to the reaction mixture and the top bicyclohexyl layer was collected. This layer was precipitated in 100 milliliters of acetone. The solids were redissolved in 10 milliliters of hexane and precipitated in 100 milliliters of methanol. 1-2 milliliters of acetone were also added to reduce immiscibility. The solvents were decanted and pale-yellow polymer solids were obtained and used further in formulations.

Example 10

Formulation in MIBK of Polymer Synthesized in Example 9

In a 20 ml scintillation vial, 0.005 gram of polymer solids from Example 9 were weighed and 9.995 grams of MIBK were added to it. The vial was mixed until all contents were miscible. The formulation was then used for further tests.

Example 11

Formulation in MIBK of Polymer Synthesized in Example 9

In a 20 ml scintillation vial, 0.01 gram of polymer solids from Example 9 were weighed and 9.99 grams of MIBK were added to it. The vial was mixed until all contents were miscible. The formulation was then used for further tests.

Example 12

Formulation in MIBK of Polymer Synthesized in Example 9

In a 20 ml scintillation vial, 0.02 gram of polymer solids from Example 9 were weighed and 9.98 grams of MIBK were added to it. The vial was mixed until all contents were miscible. The formulation was then used for further tests.

Example 13

Light-Responsive Patterning and Grafting to Glass Substrates with Formulations from Examples 10, 11, and 12

On three separate 4" silicon reclaimed wafers, the formulations from Examples 11, 12, and 13 were spin coated at 1500 rpm for 60 seconds. Half of these wafers were covered with another silicon wafer that was cut in half as a light-blocking mask. This wafer set up was exposed to UV radiation on an Intelli-ray 600 UV exposure tool for 1 second at 100% intensity corresponding to a dose of 172 mJ/cm$^2$. The mask was removed, and the wafer was rinsed with MIBK three times after puddling with the MIBK solvent for 20 seconds. Finally, water contact angles and thicknesses were measured on exposed and unexposed areas of the wafers. The water contact angle measurements are reported in Table 2.

TABLE 2

Water contact angles (CA) of coated and exposed wafers

| Example formulation | Pre-exposure thickness (Å) | Exposed thickness (Å) | Un-exposed thickness (Å) | Exposed $H_2O$ CA (°) | Un-exposed $H_2O$ CA (°) |
|---|---|---|---|---|---|
| 10 | 32 | 35 | 10 | 37 | 29 |
| 11 | 46 | 25 | 16 | 38 | 29 |
| 12 | 74 | 70 | 19 | 102 | 28 |

Example 14

Light-Responsive Patterning and Grafting on Glass Substrates with Formulations from Example 12

On five glass substrates, the formulation from Example 12 was spin coated at 1500 rpm for 60 seconds. Half of these wafers were covered with a silicon wafer that was cut in half as a light-blocking mask. This wafer set up was exposed to UV radiation on an Intelli-ray 600 UV exposure tool for 1 second at intensities from 20% to 100%. The mask was removed, and the wafer was rinsed with MIBK three times after puddling with the MIBK solvent for 20 seconds. Finally, water contact angles were measured on exposed and unexposed areas of the wafers. The water contact angle measurements are reported in Table 4.

TABLE 4

Light-catalyzed grafting on glass

| Lamp power (%) | Estimated dose (mJ/cm$^2$) | Exposed $H_2O$ CA (°) | Unexposed $H_2O$ CA (°) |
|---|---|---|---|
| 100 | 172 | 101 | 71 |
| 80 | 138 | 104 | 61 |

TABLE 4-continued

| Light-catalyzed grafting on glass | | | |
|---|---|---|---|
| Lamp power (%) | Estimated dose ($mJ/cm^2$) | Exposed $H_2O$ CA (°) | Unexposed $H_2O$ CA (°) |
| 60 | 103 | 104 | 73 |
| 40 | 69 | 97 | 60 |
| 20 | 34 | 104 | 67 |

The invention claimed is:

1. A method of forming a structure, said method comprising:

(a) providing a substrate having a substrate surface and one or more intermediate layers optionally present on said substrate surface;

(b) applying a surface modifying composition to said substrate surface or to an uppermost surface of said top intermediate layer, if present, to form a surface modifying layer, said surface modifying composition comprising a polymer including at least first and second monomers, wherein:

said first monomer comprises a surface modifying group; and said second monomer is different from said first monomer and comprises a light-sensitizing group, and wherein said polymer does not include fluorine atoms;

(c) selectively exposing portions of said surface modifying layer to light having a wavelength between about 100 nm and about 700 nm to provide light-exposed portions of said surface modifying layer and unexposed portions of said surface modifying layer; and (d) removing said unexposed portions of said surface modifying layer while said light-exposed portions of said surface modifying layer remain on said substrate surface or uppermost surface of said top intermediate layer, if present.

2. The method of claim 1, wherein said substrate surface or said uppermost surface of said top intermediate layer, if present, has a first surface energy, and wherein said surface modifying layer has a second surface energy different from said first surface energy and wherein said second surface energy is lower than said first surface energy.

3. The method of claim 1, wherein said surface modifying layer has at least one of:

a water contact angle greater than about 80°; and a PGMEA static contact angle greater than about 40°.

4. The method of claim 1, wherein said surface modifying group is chosen from $C_8$ to $C_{36}$ alkyls, octadecylalcohol, octadecylamine, behenyl alcohol, behenyl amine, tridecyl alcohol, tridecyl amine, lauryl alcohol, lauryl amine, or combinations thereof.

5. The method of claim 1, wherein said light sensitizing group is chosen from 2-hydroxy-4-methoxybenzophenone, hydroxybenzophenone, aminobenzophenone, 4-benzoylbenzoic acid, 4-(bromomethyl) benzophenone, sodium azide, diazirine, anthracene, compound (I) below compound (II) below:

(I)

$$R-\overset{+}{N}\equiv N, \quad Cl^-$$

-continued (II)

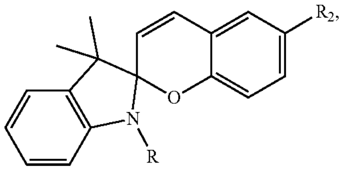

or combinations thereof.

6. The method of claim 1, wherein said polymer is chosen from-

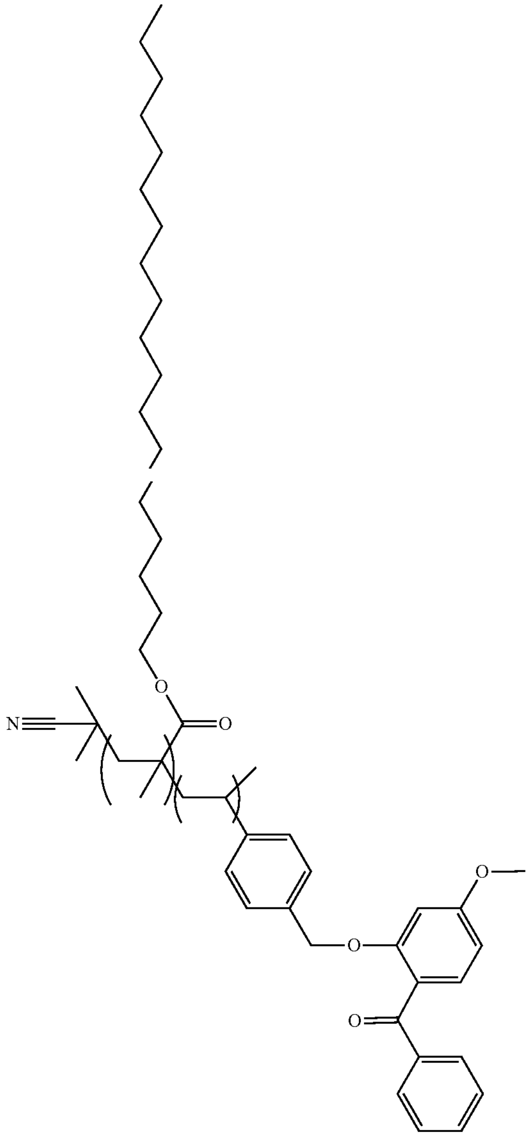

or

-continued

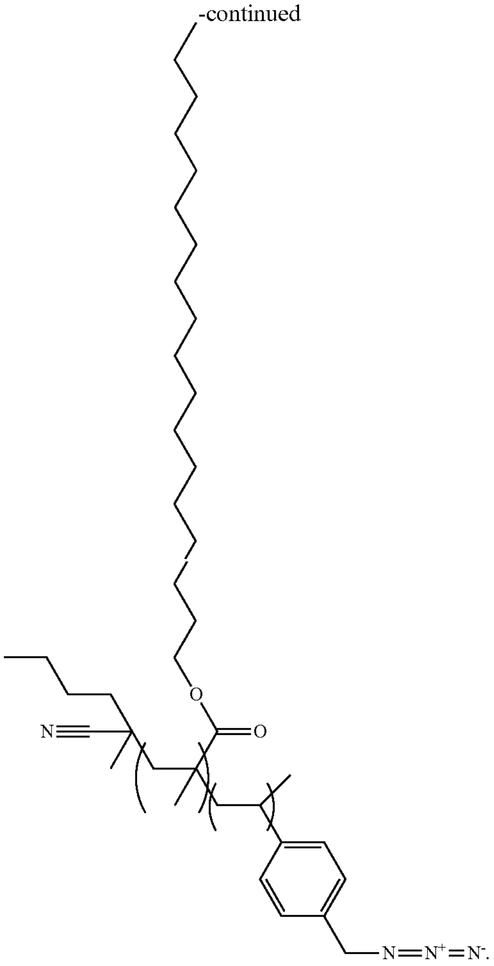

7. The method of claim 1, wherein said first monomer is present in said polymer in an amount of from about 75 mol % to about 95 mol % and said second monomer is present in said polymer in an amount of from about 5 mol % to about 40 mol %, based on said total moles of said polymer taken as 100%.

8. The method of claim 1, wherein said polymer further comprises a third monomer for enhancing the solubility of said polymer, wherein said third monomer is chosen from methyl methacrylate, styrene, methyl methacrylate, methylstyrene, 4-tert-butylstyrene, n-butyl methacrylate, benzyl methacrylate, tert-butyl methacrylate, and combinations thereof.

9. The method of claim 1, wherein said first and/or said second monomer comprise a base monomer chosen from 4-chloromethylstyrene, 4-azido methylstyrene, glycidyl methacrylate, methacryloyloxyethyl isocyanate, azidopropyl methacrylate, methacryloyl chloride, or combinations thereof, and wherein said base monomer has been functionalized with said surface modifying group and/or said light sensitizing group.

10. The method of claim 1, wherein said applying comprises spin coating said surface modifying composition onto said substrate surface or said uppermost surface of said top intermediate layer, if present; the method further comprising, after said applying, baking said surface modifying composition to form said surface modifying layer, wherein said baking is performed at a temperature in the range of from about 80° C. to about 120° C. for about 20 seconds to about 60 seconds, wherein said surface modifying layer has a thickness of about 1 nm to about 30 nm prior to said exposing, and wherein said selectively exposing comprises subjecting said portions of the surface modifying layer to a dose of energy in the range of from about 50 mJ/$cm^2$ to about 300 mJ/$cm^2$.

* * * * *